United States Patent [19]

Nishijima et al.

[11] 4,197,505
[45] Apr. 8, 1980

[54] LIMITER CIRCUIT

[75] Inventors: Hideo Nishijima, Yokohama; Isao Fukushima, Fujisawa; Hiroyuki Kimura, Yokohama, all of Japan

[73] Assignee: Hitachi, Ltd., Japan

[21] Appl. No.: 875,793

[22] Filed: Feb. 7, 1978

[30] Foreign Application Priority Data

Feb. 8, 1977 [JP] Japan .................. 52-12177
Feb. 8, 1977 [JP] Japan .................. 52-12178
Sep. 2, 1977 [JP] Japan .................. 52-104951

[51] Int. Cl.² ................ H04B 1/16; H04B 15/00; H03G 11/04
[52] U.S. Cl. .................. 455/309; 307/237; 328/171; 330/261

[58] Field of Search ............... 325/319, 348, 402, 482, 325/313, 474, 475, 477; 307/237, 264; 328/169, 171; 330/261

[56] References Cited

U.S. PATENT DOCUMENTS 3,846,712  11/1974  Kiko ........................ 330/261

Primary Examiner—Marc E. Bookbinder
Attorney, Agent, or Firm—Craig and Antonelli

[57] ABSTRACT

A limiter circuit comprises circuit means for variably controlling a current source for a differential amplifier in accordance with the magnitude of a modulating signal carried by a carrier or a percentage modulation.

24 Claims, 17 Drawing Figures

FIG. 1 PRIOR ART
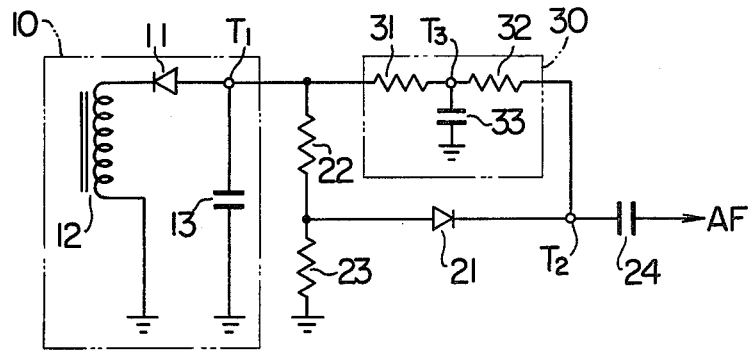
FIG. 2A PRIOR ART
FIG. 2B PRIOR ART
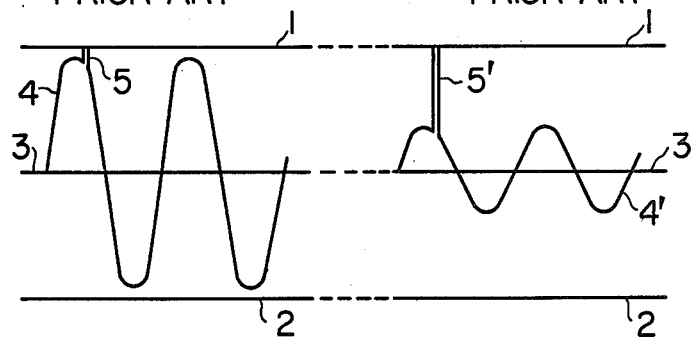
FIG. 3
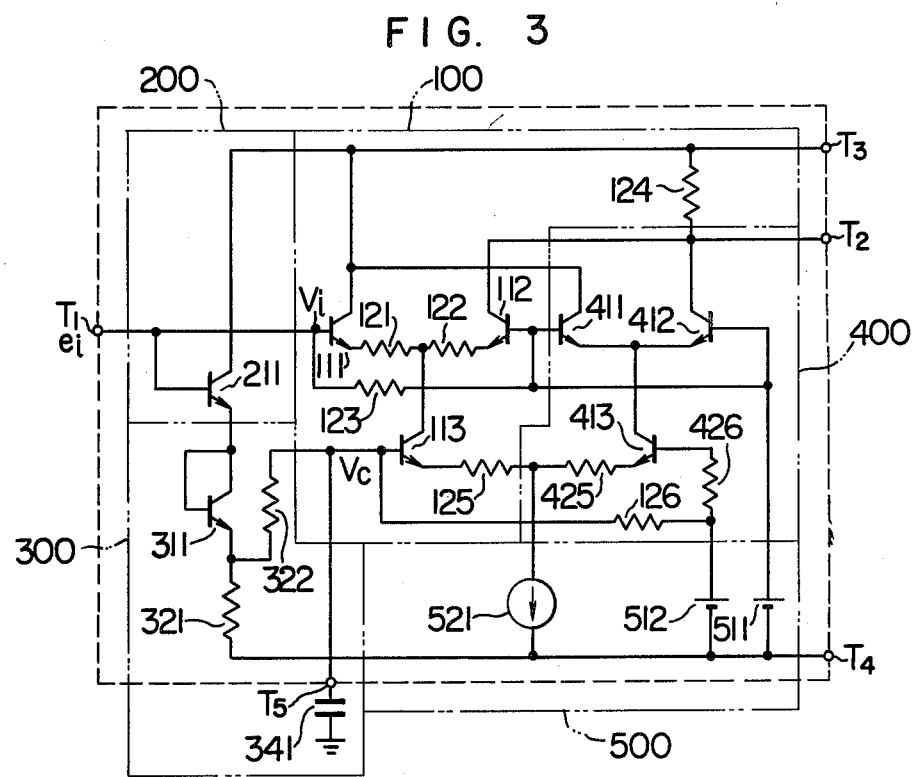

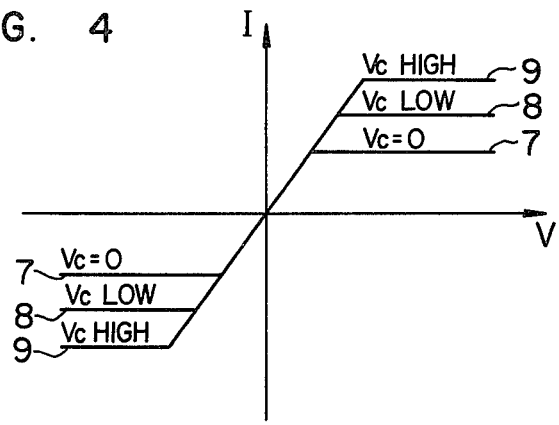
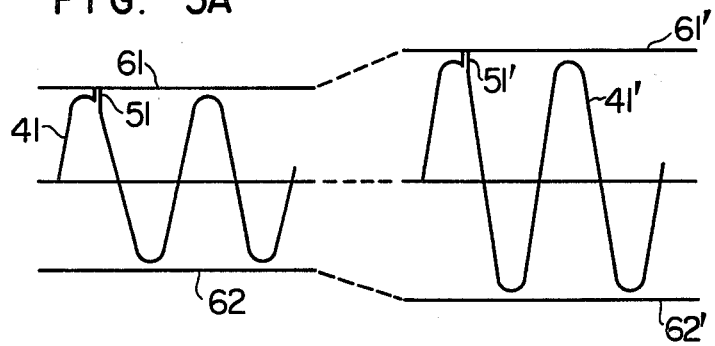
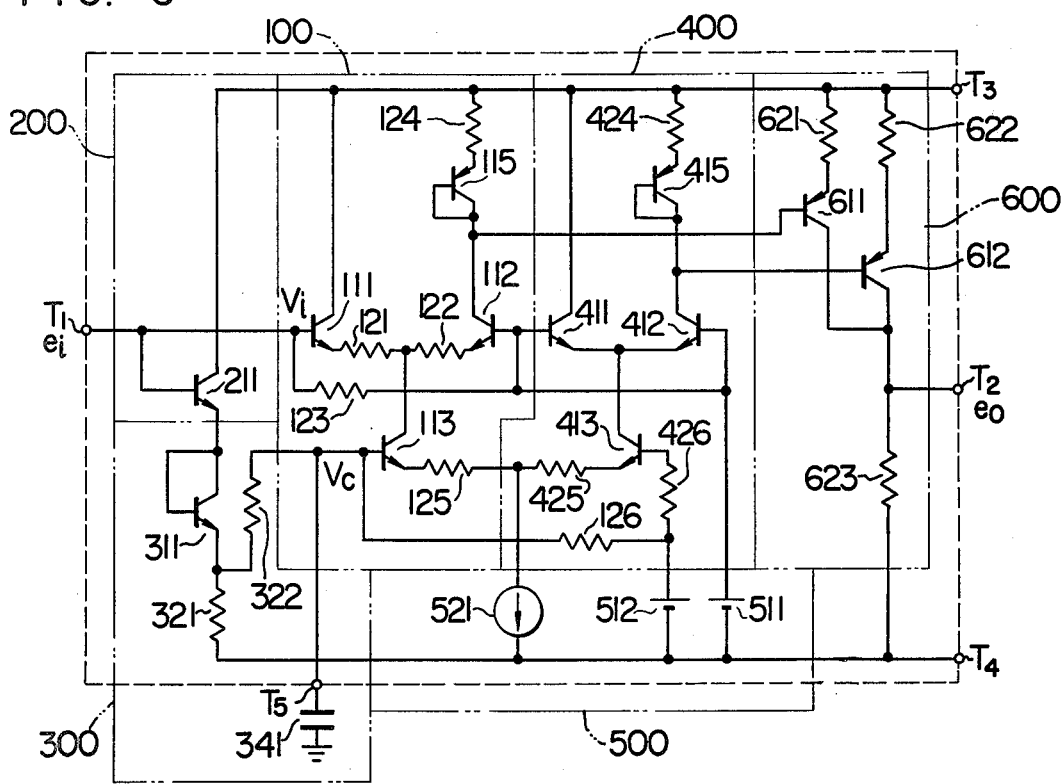

INPUT WAVEFORM
$e_i$ (DEMODULATION SIGNAL)

CONTROL SIGNAL WAVEFORM $V_c'$

LIMITING LEVEL

OUTPUT WAVEFORM $e_o$

LIMITER CIRCUIT

BACKGROUND OF THE INVENTION

1. FIELD OF THE INVENTION

The present invention relates to a limiter circuit suited for use in a vehicle mounted receiver, and more particularly to a limiter circuit for limiting a pulsive noise superimposed on an modulating signal.

2. DESCRIPTION OF THE PRIOR ART

A vehicle-mounted receiver such as a radio receiver or a CB tranceiver is apt to be subjected to the influence of a pulsive noise produced by an internal combustion engine of an automobile. Accordingly, the vehicle-mounted receiver usually has a limiter circuit for limiting the pulsive noise.

An example of a prior art limiter circuit is shown in FIG. 1, in which connected between an anode of a detecting diode 11 of a detector circuit 10, that is, a detection signal input terminal $T_1$ and a detection signal output terminal $T_2$ are a limiting diode 21, dividing resistors 22 and 23 for dividing a modulation signal (demodulation signal) and a D.C. voltage appearing at the input terminal $T_1$ and supplying the divided voltage to the anode of the limiting diode 21, resistors 31 and 32 for deriving only the D.C. component from the modulation signal and the D.C. voltage appearing at the input terminal $T_1$ and supplying the D.C. component to a cathode of the limiting diode 21, and a filtering circuit 30 comprising a large capacitance capacitor 33. During normal reception of the signal, the detecting diode 11 is biased to its conductive state and the limiting diode 21 is biased to its cut off state when the pulsive noise is superimposed on the modulation signal so that the pulsive noise exceeds a level of AM 100% modulation and a potential at the anode of the limiting diode 21 falls below a potential at the cathode thereof by the pulsive noise limiting the pulsive noise.

FIGS. 2A and 2B show waveforms for explaining the operation of the limiter circuit. In FIGS. 2A and 2B, line 1 represents a ground potential, line 2 represents a D.C. bias potential at the cathode of the limiting diode 21, a line 3 represent a D.C. bias potential at the anode of the limiting diode 21, a curve 4 represents a modulation signal at 100% modulation of an AM carrier, numeral 5 represents a pulsive noise superimposed on the modulation signal 4, a curve 4' represents a modulation signal when the percent modulation of the AM carrier is below 100%, and numeral 5' represents a pulsive noise superimposed on the modulation signal 4'.

In the limiter circuit shown in FIG. 1, a limiting level is determined by a D.C. voltage (AGC voltage) produced in accordance with the level of the carrier. Thus, when the limiting level is set to the amplitude of the modulation signal at 100% modulation of the AM carrier, the noise 5 shown in FIG. 2A can be fully limited at the high percent modulation, but the pulsive noise appears at a high amplitude and the limiting effect is materially reduced at a low percent modulation as shown in FIG. 2B.

If the limiting level is lowered to avoid the above problem, the modulation signal at the high percent modulation will also be limited so that the waveform of the modulation signal will be distored. Accordingly, a trade-off of the limiting level at an appropriate level has been obliged.

Furthermore, the limiter circuit of FIG. 1 is not suited for construction in an IC structure in view of a large number of capacitors used.

SUMMARY OF THE INVENTION

It is an object of the present invention to provide a limiter circuit which is readily implemented in an IC structure and attains a satisfactory limiting effect to a pulsive noise.

It is another object of the present invention to provide a limiter circuit which varies a limiting level in accordance with a magnitude of a modulation signal, that is, a percent modulation.

In order to achieve the above object the limiter circuit of the present invention includes circuit means for variably controlling a current source for a differential amplifier in accordance with a magnitude of a modulation signal carried by a carrier, that is, a percent modulation.

BRIEF DESCRIPTION OF THE DRAWINGS

FIG. 1 shows a circuit diagram of a prior art limiter circuit;

FIGS. 2A and 2B show waveforms for explaining the operation of the circuit of FIG. 1;

FIG. 3 shows a circuit diagram of one embodiment of the limiter circuit of the present invention;

FIG. 4 shows characteristic curves for explaining the operation of the circuit of FIG. 3;

FIGS. 5A and 5B show waveforms for explaining the operation of the circuit of FIG. 3;

FIG. 6 shows a circuit diagram of an improved limiter circuit over the circuit of FIG. 3;

DESCRIPTION OF THE PREFERRED EMBODIMENTS

Figure 7:
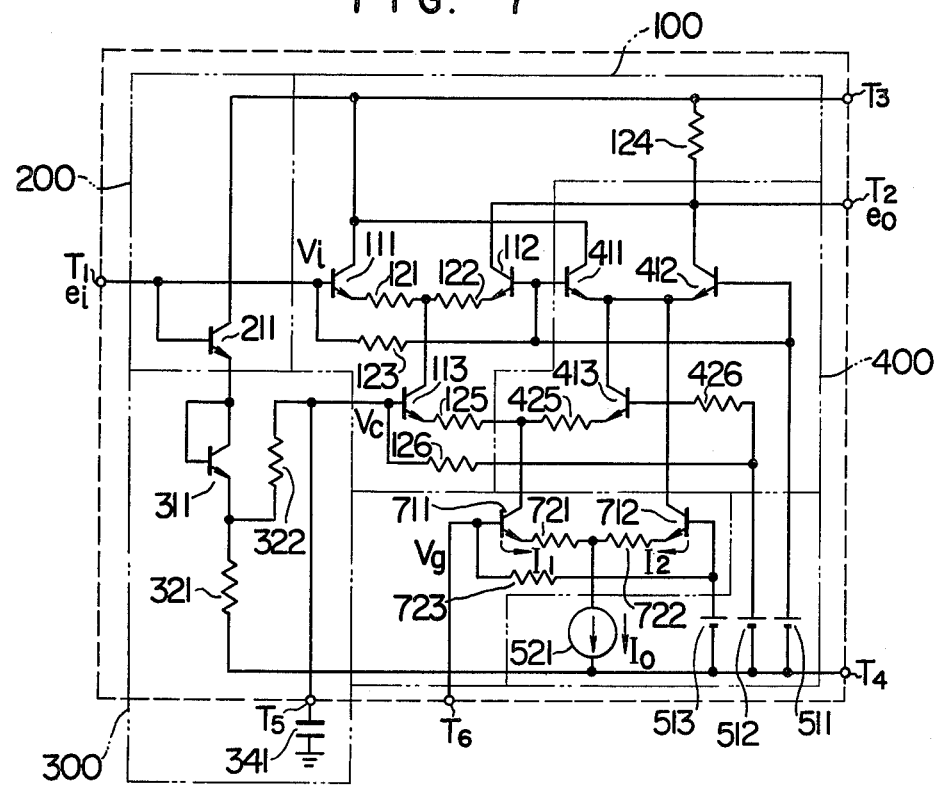
FIG. 7 shows a circuit diagram of another embodiment of the limiter circuit of the present invention.

Referring now to the accompanying drawings, the preferred embodiments of the present invention are explained. FIG. 3 shows a circuit diagram of one embodiment of the limiter circuit of the present invention. In FIG. 3, $T_1$ denotes an input terminal for a modulation signal (audio signal) $e_i$, and numeral 100 denotes an amplitude limiting amplifier circuit which comprises differential amplifier transistors 111 and 112 having a function of amplifying the modulation signal $e_i$ applied to the input terminal $T_1$ and limiting a pulsive noise superimposed on the modulation signal, a current source transistor 113 for the transistors 111 and 112 and resistors 121, 122, 123, 124, 125 and 126 for defining magnitudes of currents which flow through the transistors 111, 112 and 113, a base of the transistor 111 is connected to the input terminal $T_1$ and also connected to a ground terminal $T_4$ through the resistor 123 and an operating voltage supply 511. A collector of the transistor 111 is connected to a voltage supply terminal $T_3$ ($V_{cc}$). A base of the transistor 112 is connected to the ground terminal $T_4$ through the operating voltage supply 511, and a collector thereof is connected to the voltage supply terminal T₃ through the load resistor 124 and also connected directly to an output terminal T₂. Emitters of the transistors 111 and 112 are coupled together through the resistors 121 and 122. A collector of the transistor 113 is connected to the emitter of the transistor 111 through the resistor 121 and also connected to the emitter of the transistor 112 through the resistor 122. A base of the transistor 113 is connected to the ground terminal T₄ through the resistor 126 and the operating voltage source 512.

Numeral 200 denotes a circuit for detecting the modulation signal applied to the input terminal T₁ and it comprises a transistor 211. A base of the transistor 211 is connected to the input terminal T₁ and a collector thereof is connected to the power supply terminal T₃.

Numeral 300 denotes a rectifying circuit for rectifying the modulation signal detected by the modulation signal detecting circuit 200 and supplying the rectified D.C. voltage to the base of the current source transistor 113 of the amplitude limiting amplifier circuit 100, and it comprises a rectifying transistor 311, a resistor 321, a filtering resistor 322 and a filtering capacitor 341. A base and a collector of the transistor 311 are connected together and to an emitter of the transistor 211. An emitter of the transistor 311 is connected to the ground terminal T₄ through the resistor 321, and also connected to the base of the transistor 113 through the resistor 322 and is further grounded through the resistor 322, the terminal T₅ and the capacitor 341. The transistor 311 may be replaced by a diode. The D.C. voltage derived from the rectifying circuit changes proportionally to the magnitude of the modulation signal $e_i$ applied at the input terminal T₁, that is, the percent modulation. This D.C. voltage is supplied to the base of the current source transistor of the amplitude limiting amplifier circuit 100 to increase the current flowing through the transistor 113 to act as a control signal $V_c$ which controls an input-output characteristic of the differentially amplifying transistors 111 and 112, that is, a limiting level.

Numeral 400 denotes an output bias compensation circuit for compensating the change of the bias for the output terminal T₂ when the current of the amplitude limiting amplifier circuit 100 is controlled by the control signal $V_c$, and it comprises a differentially amplifying transistors 411 and 412, a current source transistor 413 therefor and resistors 425 and 426. Collectors of the transistors 411 and 412 are respectively connected to the collectors of the differentially amplifying transistors 111 and 112 of the amplitude limiting amplifier circuit 100. Bases and emitters of the transistors 411 and 412 are connected together, respectively, and the bases of the transistors 411 and 412 are connected to the ground terminal T₄ through the operating voltage supply 511, and the emitters of the transistors 411 and 412 are connected to a collector of the transistor 413. A base of the transistor 413 is connected to the ground terminal T₄ through the operating voltage supply 512.

The current source transistor 113 of the amplitude limiting amplifier circuit 100 and the current source transistor 413 of the compensation circuit 400 are connected differentially with the emitters of both transistors being coupled together through the resistors 125 and 425.

Numeral 500 denotes a constant current source circuit for driving the amplitude limiting amplifier circuit 100 and the compensation circuit 400, and it comprises the operating voltage supplies 511 and 512 and the constant current source 521 for the transistors 113 and 413.

The operation of the circuit of FIG. 3 is now explained. In FIG. 3, assuming that a constant current of $I_o$ is supplied from the constant current source 521 when the signal is absent, that is, when the input signal $e_i$ and the control signal (D.C. voltage) $V_c$ at the input terminal T₁ are zero, a current of $I_o/2$ flows through the transistors 113 and 413, respectively and a current of $I_o/4$ flows through the transistors 111, 112, 411 and 412, respectively. A combined current of $I_o/2$ of the transistors 112 and 412 flows through the resistor 124 and hence to the output terminal T₂. The magnitudes of the currents flowing through the transistors 111 and 112 and the transistors 411 and 412 are chosen to be equal for the purpose of simplification of the explanation, but they may be different from each other. In essence, it is sufficient that the magnitude of the combined current of the transistors 111 and 411 is equal to the magnitude of the combined current of the transistors 112 and 412. In actual, the currents of the transistors 111, 112 and 113 are chosen to be smaller than the currents of the transistors 411, 412 and 413 in order to improve the linearity of the input output characteristic of the transistors 111 and 112. The resistors 121 and 122 are used to adjust the linearity.

When the modulation signal $e_i$ is applied to the input terminal T₁, the control signal $V_c$ which is proportional to the input signal $e_i$ is applied to the base of the transistor 113. As the control signal $V_c$ increases from zero level, the current of the transistor 113 of the amplitude limiting amplifier circuit 100 increases accordingly and the currents of the transistors 111 and 112 also increase. The current of the transistor 413 of the compensation circuit 400 decreases by the amount of increase of the current of the transistor 113 and the currents of the transistors 411 and 412 decrease accordingly. When the current flowing in the transistor 113 increases by $\Delta I_o$ to reach the amount of $I_o/2 + \Delta I_o$, a current of $I_o/4 + \Delta I_o/2$ flows in the transistors 111 and 112, a current of $I_o/2 - \Delta I_o$ flows in the transistor 413, and a current of $I_o/4 - \Delta I_o/2$ flows in the transistors 411 and 412. Accordingly, the current flowing into the output terminal T₂ amounts to $(I_o/4 + \Delta I_o/2) + (I_o/4 - \Delta I_o/2) = I_o/2$. In this manner, the output bias (D.C. voltage) is kept constant to the change of the control signal $V_c$.

The limiting operation of the transistors 111 and 112 to the input voltage $v_i$ of the input signal $e_i$ under the application of the control signal $V_c$ is now explained.

When the input voltage $v_i$ of the input signal $e_i$ is zero, the current of $I_o/4 + \Delta I_o/2$ flows in the transistors 111 and 112 as described above.

During a positive half cycle of the input signal $e_i$, that is, when the input voltage $v_i$ changes in a positive direction from zero level, the current of the transistor 111 increases from $I_o/4 + I_o/2$ up to $I_o/2 + AI_o$ and the current of the transistor 112 decreases from $I_o/4 + \Delta I_o/2$ down to zero. When the positive voltage of the input voltage $v_i$ reaches a certain level so that the current of the transistor 111 changes from $I_o/4 + \Delta I_o/2$ to $I_o/2 + \Delta I_o$, the current of the transistor 112 reaches zero and the transistor 112 is cut off.

During a negative half cycle of the input signal $e_i$, that is, when the input voltage $v_i$ changes in a negative direction from zero level, the current of the transistor 111 decreases from $I_o/4 + \Delta I_o/2$ down to zero and the current of the transistor 112 increases from $I_o/4 + \Delta I_o/2$ up to $I_o/2 + \Delta I_o$. When the negative voltage of the input voltage $v_i$ reaches a certain level so that the current of the transistor 112 reaches $I_o/2$, the current of the transistor 111 reaches zero and the transistor 111 is cut off.

In this manner, when the one of the transistors 111 and 112 is cut off, the input voltage $v_i$ changes beyond the predetermined level so that the increase of the current in the other transistor is stopped. Thus, the currents of the transistors 111 and 112 change from the initial magnitude $I_o/4+\Delta I_o/2$ by the amount of $\pm(I_o/4+\Delta I_o/2)$ at most irrespective of the amount of change of the input voltage $v_i$, and the current at the output terminal $T_2$ changes from the initial magnitude $I_o/2$ by the amount of $\pm(I_o/4+\Delta I_o/2)$ at most. The larger the current $\Delta I_o$ is, the larger is the change thereby. Accordingly, by changing the current $\Delta I_o$ by the control signal $V_c$, the limiting level of the transistors 111 and 112 can be changed.

FIG. 4 shows characteristic curves illustrating a relation between the input-output characteristic of the amplitude limiting amplifier circuit 100 and the control signal $V_c$, in which an abscissa represents an input voltage V at the input terminal $T_1$ and an ordinate represents an output current I of the transistors 111 and 112. In FIG. 4, the characteristic curves 7, 8 and 9 show the characteristic when the control signal $V_c$ is at zero level, a low level and a high level, respectively.

It is seen from the characteristic curves 7, 8 and 9 of FIG. 4 that a saturation level of the output current increases as the control signal $V_c$ increases. Thus, the input-output characteristic of the transistors 111 and 112 and hence the limiting level of the transistors 111 and 112 can be controlled by controlling the control voltage $V_c$.

FIGS. 5A and 5B show waveforms illustrating a relation among the modulation signal, the pulsive noise and the limiting level for the characteristic curves 8 and 9 shown in FIG. 4. In FIGS. 5A and 5B, a curve 41 represents a modulation signal at a percent modulation below 100% of an AM carrier, numeral 51 represents a pulsive noise superimposed on the modulation signal 41, lines 61 and 62 represent limiting levels for the modulation signal 41, a curve 41' represents a modulation signal at 100% modulation of the AM carrier, numeral 51' represents a pulsive noise superimposed on the modulation signal 41', and lines 61' and 62' represent limiting levels for the modulation signal 41'.

It is seen from the waveforms that the pulsive noises superimposed on the top and bottom of the modulation signal can be effectively limited by controlling the limiting level in accordance with the magnitude of the modulation signal, that is, the percent modulation so that the limiting level is set to be slightly higher than the magnitude of the modulation signal.

In order to make the limiting level during the limiter level control to be slightly larger than the modulating signal, the limiter levels 61' and 62' for the 100% modulation of the AM carrier may be selected to be slightly larger than the modulating signal 41' at the 100% modulation of the AM carrier, as shown in FIG. 5B. This may be readily achieved by appropriately setting the base bias voltages for the current source transistors 113 and 413. For example, if the base bias voltage for the current source transistor 413 is lowered, the amount of current supplied to the current source transistor 413 reduces accordingly and the amount of current supplied to the current source transistor 113 increases so that the limiting levels 61' and 62' rise. When the base bias voltage for the current source transistor 413 is raised, the limiting levels 61' and 62' falls in contrast to the previous case. In this manner, the relation between the limiting levels during the limiter level control and the modulating signal can be established as shown in FIG. 5.

Further, since the circuit configuration of FIG. 3 includes only one capacitor which is undesirable for implementing the circuit in an IC structure, the fabrication of the circuit by IC structure is facilitated.

FIG. 6 shows a circuit diagram of another embodiment of the limiter circuit similar to that of FIG. 3, in which the circuit is compensated for the change of gain of the circuit when the current flowing in the amplitude limiting amplifier circuit 100 is controlled to control the limiting level. In FIG. 6, the like parts to those of FIG. 3 are designated by like numerals and they are not explained here. Numeral 115 denotes a gain compensating transistor of the amplitude limiting amplifier circuit 100 and a base and a collector of the transistor 115 are connected together and to the collector of the transistor 112, and an emitter of the transistor 115 is connected to the power supply terminal $T_3$ through the resistor 124. The transistor 115 may be replaced by a diode. A gain $G_1$ of the amplitude limiting amplifier circuit 100 including the transistor 115 is given by:

$$G_1 = \frac{R_{124} + \gamma_{e115}}{R_{121} + R_{122} + \gamma_{e111} + \gamma_{e112}}$$
$$(\gamma_e = 26/I,\ 26 = q/KT)$$

where $R_{121}$, $R_{122}$, $R_{124}$: resistances of the resistors 121, 122 and 124.

$\gamma_{e111}$, $\gamma_{e112}$, $\gamma_{e115}$: operating resistances of the transistors 111, 112 and 115, which are usually represented by 26/I.

I: operating currents of the transistors 111, 112 and 115.

q: charge

K: Boltzman's constant

T: temperature

In the amplitude limiting amplifier circuit thus constructed, by controlling the current flowing in the current source transistor 113 to control the current flowing in the differentially amplifying transistors 111 and 112, the operating resistances $\gamma_{e111}$ and $\gamma_{e112}$ of the transistors 111 and 112 change in accordance with the amount of control. The changes of the operating resistances $\gamma_{e111}$ and $\gamma_{e112}$ influence the gain $G_1$ of the amplitude limiting amplifier circuit 100, particularly in a low current region and when $R_{121}$, $R_{122} < \gamma_{e111}$, $\gamma_{e112}$. However, since the operating resistance $\gamma_{e115}$ also changes under this circumstance, the changes of the operating resistances $\gamma_{e111}$ and $\gamma_{e112}$ of the transistors 111 and 112 can be compensated by the change of the operating resistance $\gamma_{e115}$ of the transistor 115 so that the variation of the gain $G_1$ of the amplifier circuit 100 due to the control of the operating current can be reduced. Further, in this case, the bias currents flowing in the transistors 111, 112 and 115 are equal to each other and the operating resistances $\gamma_{e111}$, $\gamma_{e112}$ and $\gamma_{e115}$ and substantially equal to each other. Accordingly, by choosing the resistances $R_{121}$, $R_{121}$ and $R_{124}$ of the resistors 121, 122 and 124 of the amplifier circuit 100 to satisfy the following relation:

$$\frac{R_{124}}{R_{121} + R_{122}} \approx \frac{\gamma_{e115}}{\gamma_{e111} + \gamma_{e112}} \approx \frac{1}{2}$$

the gain $G_1$ of the amplifier circuit 100 can be kept constant.

Numeral 611 denotes a grounded emitter amplifying transistor which amplifies a signal appearing at the collector of the transistor 112 of the amplitude limiting amplifier circuit 100 and feeds the amplified signal to the output terminal $T_2$, and cooperates with the transistor 115 to compensate for the changes of the operating resistances $\gamma_{e111}$ and $\gamma_{e112}$ of the transistors 111 and 112 to keep the gain of the entire circuit constant. A base of the transistor 611 is connected to the collector of the transistor 111 and an emitter is connected to the power supply terminal $T_3$ through a resistor 621. A collector of the transistor 611 is connected to the ground terminal $T_4$ through a resistor 623 and also connected to the output terminal $T_2$.

A gain $G_2$ of the grounded emitter amplifying transistor 611 is given by:

$$G_2 = \frac{R_{623}}{R_{621} + \gamma_{e611}}$$

where $R_{621}$, $R_{623}$: resistances of the resistors 621 and 623.
$\gamma_{e611}$: operating resistance of the transistor 611.

By choosing the resistance $R_{621}$ of the resistor 621 to be much large than the operating resistance $\gamma_{e611}$ of the transistor 611 ($R_{621} >> \gamma_{e611}$) to suppress the change of the gain $G_2$ for the change of the operating resistance $\gamma_{e611}$, or by choosing the resistances such that an overall gain $G_3 = G_1 \cdot G_2$ or $$G_3 = \frac{R_{124} + \gamma_{e115}}{R_{121} + R_{122} + \gamma_{e111} + \gamma_{e112}} \cdot \frac{R_{623}}{R_{621} + \gamma_{e6111}}$$

is maintained constant for the change of the operating resistance $\gamma_e$, the change of the gain can be compensated.

Numeral 415 denotes an output bias compensating transistor for the output terminal $T_2$, and a base and a collector of the transistor 415 are connected together and to the collector of the transistor 412 and an emitter is connected to the power supply terminal $T_3$ through a resistor 424. The transistor 415 may be replaced by a diode.

Numeral 612 denotes a grounded emitter amplifying transistor which cooperates with the transistor 415 to compensate for the change of the output bias at the output terminal $T_2$ due to the provision of the transistor 115 in the amplitude limiting amplifier circuit 100, and a base of the transistor 612 is connected to the collector of the transistor 412, an emitter thereof is connected to the power supply terminal $T_3$ through a resistor 622 and a collector thereof is connected to the output terminal $T_2$.

By choosing the constants of the output bias compensating circuit 400 including the transistors 415 and 612 and the resistors 424 and 622 to be equal to the constants of the amplitude limiting amplifier circuit 100 including the transistor 115 and the resistor 124, the D.C. bias flowing through the resistor 623 can be kept constant.

FIG. 7 shows a circuit diagram of another embodiment of the present invention. FIG. 7, like parts to those of FIG. 3 are designated by like numerals, and they are not explained here. In FIG. 7, numeral 700 denotes a differential amplifier circuit acting as a current source for the amplitude limiting amplifier circuit 100 and the output bias compensating circuit 400, and it comprises differentially amplifying transistors 711 and 712 and resistors 721, 722 and 723. Emitters of the transistors 711 and 712 are coupled together through the resistors 721 and 722 and the emitter of the transistor 711 is connected to the ground terminal $T_4$ through the resistor 721 and a constant current source 521. A collector of the transistor 711 is connected to the emitters of the transistors of the amplifier circuit 100 and the compensating circuit 400 through the emitter resistors 125 and 425, and a base thereof is connected to the ground terminal $T_4$ through a resistor 724 and the operating voltage supply 513, and also connected to a control terminal $T_6$. a collector of the transistor 712 is connected directly to the emitters of the transistors 411 and 412 of the compensating circuit 400, and a base thereof is connected to the ground terminal $T_4$ through the operating voltage supply 513. An AGC voltage $V_g$ derived from an AGC circuit, not shown, in accordance with a carrier level is supplied to the control terminal $T_6$. The AGC voltage $V_g$ supplied to the control terminal $T_6$ controls the current flowing in the transistor 711 which acts as the current source for the transistors 113 and 413 and cooperates with the control signal $V_c$ to act as a control signal for changing the limiting level of the amplitude limiting amplifier circuit 100.

By controlling the limiting level by the AGC voltage $V_g$ produced in accordance with the carrier level, the pulsive noise under a weak electrical field can be reduced.

If one attempts to control the limiting level by the AGC voltage $V_g$ only, the pulsive noise under the weak electrical field can be reduced as described above but when the limiting level is chosen to prevent the distortion of the modulation signal at 100% modulation under the weak electrical field, the limiting effect (ratio of the modulation signal to the pulsive noise) at a low percent modulation is lowered so that a large pulsive noise is produced for the modulation signal.

The above problem can be resolved by controlling the limiting level by the control signal $V_c$ which is proportional to the percent modulation.

The compensation for the output bias at the output terminal $T_2$ for the change of the AGC voltage $V_g$ is carried out by the transistors 411 and 412 connected to the transistor 712. By equally, dividing a current $I_2$ flowing in the transistor 712 and supplying the divided current through the resistor 124, the bias current supplied to the resistor 124 is always kept to $I_1/2 + I_2/2$ ($= I_0/2$) and is constant irrespective of the change of the AGC voltage $V_g$. $I_1$ represents a current flowing in the transistor 711.

Figure 8:
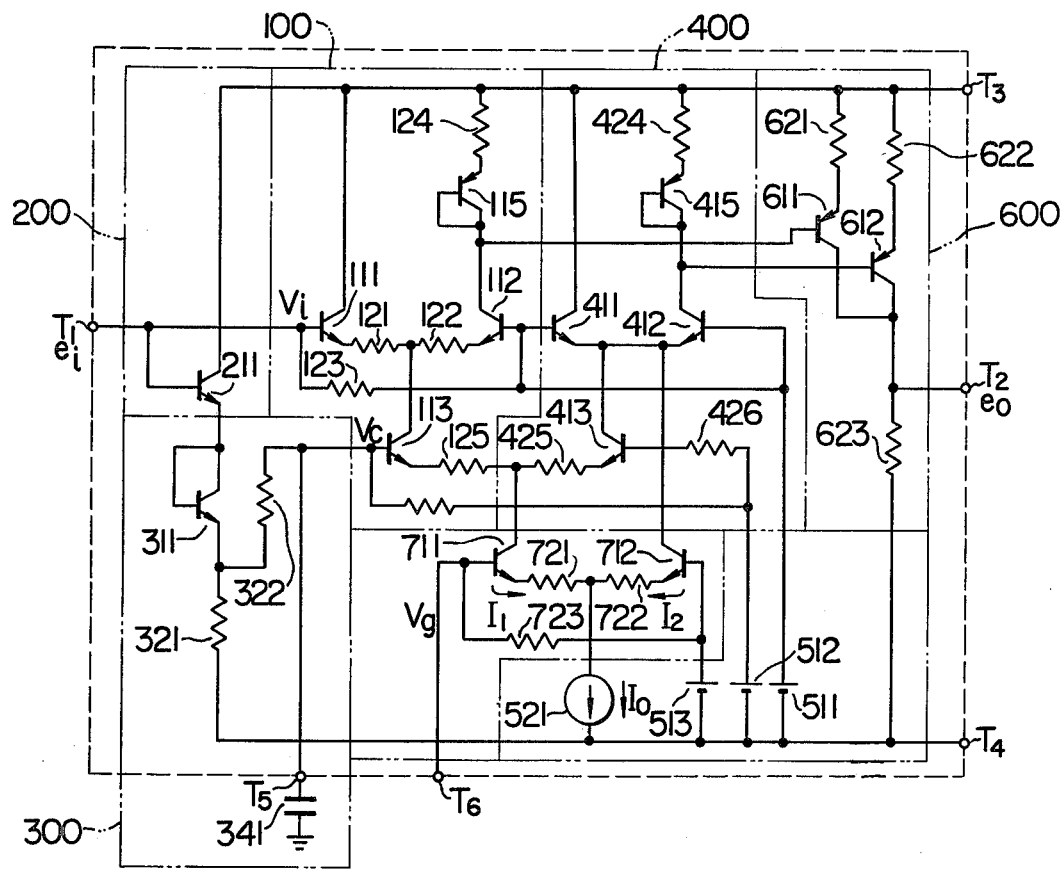
FIGS. 8 and 9 show circuit diagrams of improved limiter circuits over the circuit of FIG. 7.

FIG. 8 shows a circuit diagram of an embodiment which includes the gain compensation circuit shown in FIG. 6 in addition to the circuit of FIG. 7 in order to compensate for the change of gain of the circuit of FIG. 7 when the limiting level of the amplitude limiting amplifier circuit 100 is controlled. In FIG. 8, like parts to those shown in FIGS. 6 and 7 are designated by like numerals and they are not explained here. Also, the principle of operation of the limiting level control and the principle of operation of the output bias compensation are illustrated in FIGS. 3 and 7 and the principle of operation of the gain compensation is identical to that illustrated in FIG. 6. Therefore, they are not repeated here.

Figure 9:
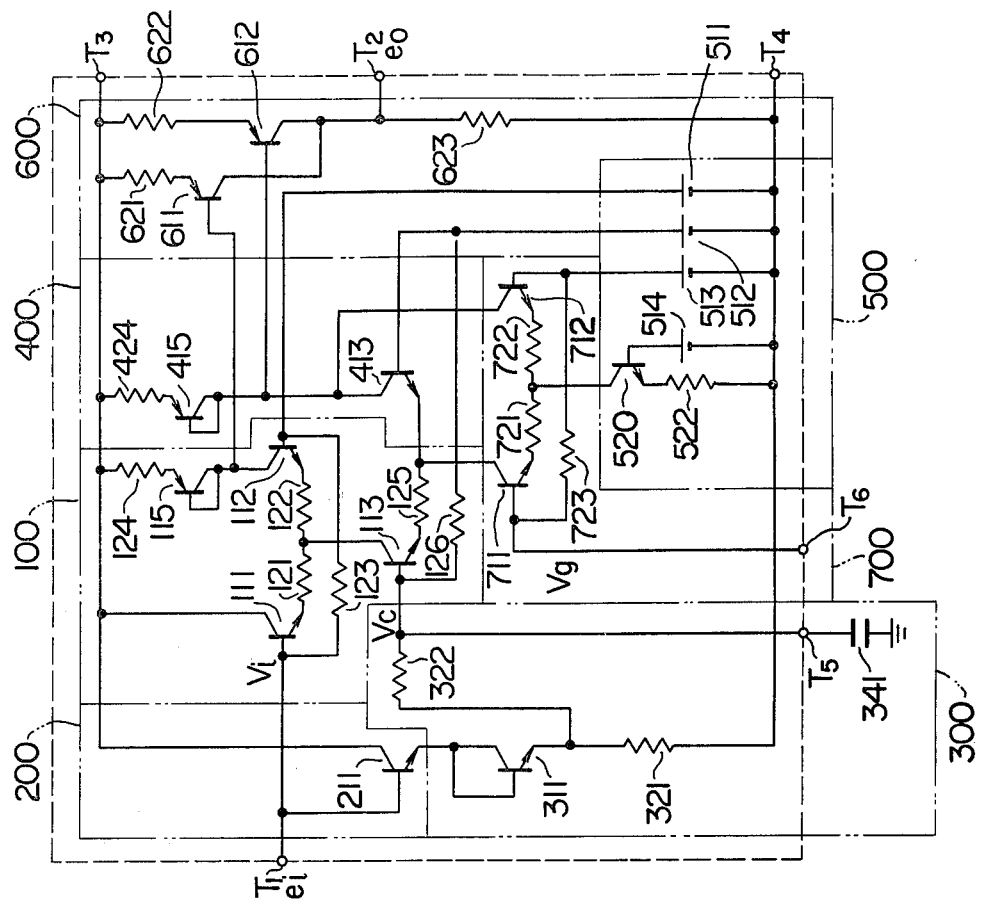

FIG. 9 shows a modification of FIG. 8 and illustrates a circuit diagram of an embodiment in which the differentially amplifying transistors 411 and 412 of the output bias compensation circuit 400 in FIG. 8 have been omitted. In FIG. 9, the output bias compensation circuit 400 includes a transistor 413, an emitter of which is connected, via a resistor 125, to the emitter of the transistor 113 of the amplitude limiting amplifier circuit 100 which further includes the differentially amplifying transistors 111 and 112, and also connected to the collector of the transistor 711 in the differential amplifier circuit 700 which further includes the differentially amplifying transistors 711 and 712. The base of the transistor 413 is connected to the base of the transistor 113 through the resistor 126, and also connected to the ground terminal $T_4$ through the operating voltage supply 513. The collector of the transistor 413 is connected to the collector of the transistor 712 and also connected to the collector and the base of the output bias compensating transistor 415, the emitter of which is connected to the power supply terminal $T_3$ through a resistor 424. The collector of the differentially amplifying transistor 111 is directly connected to the power supply terminal $T_3$. The collector of the differentially amplifying transistor 112 is connected to the power supply terminal $T_3$ through the gain compensating transistor 115 and the resistor 124. A grounded emitter amplifier circuit 600 comprises grounded emitter transistors 611 and 612, and a base of the transistor 611 is connected to the collector of the differentially amplifying transistor 112 of the amplitude limiting amplifier circuit 100, and a base of the transistor 612 is connected to the collector of the transistor 413 of the output bias compensating circuit 400. Emitters of the transistors 611 and 612 are connected to the power supply terminal $T_3$ through resistors 621 and 622, respectively, and collectors thereof are connected to the ground terminal $T_4$ through a common resistor 623, and also connected to the output terminal $T_2$. A constant current source circuit 500 comprises a constant current source transistor 520, an emitter resistor 522 therefor and an operating voltage supply 514. The remaining portions are identical to FIG. 8 and like parts to those of FIG. 8 are designated by like numerals and they are not explained here. The principle of operation of the limiter level control is illustrated in FIGS. 3 and 7, and the principle of operation of the gain compensation is identical to that of FIG. 6 and hence they are not repeated here.

The output bias compensation in FIG. 9 is now explained. In FIG. 9, when signal is absent, the currents flowing in the differentially amplifying transistor 112 of the amplitude limiting amplifier circuit 100 and the transistor 413 of the output bias compensating circuit 400 differ from each other. For example, when the constant current of the constant current source circuit 500 is represented by $I_o$, a current of $I_o/2$ flows in each of the differentially amplifying transistors of the differential amplifier circuit 700, a current of $I_o/4$ flows in each of the transistors 113 and 413, and a current of $I_o/8$ flows in each of the transistors 111 and 112.

As described above in connection with FIGS. 3 and 7, when the transistors 113 and 711 are controlled by the control voltage $V_c$ and the AGC voltage $V_g$ to control the currents flowing there through, the change in the current flowing in the transistor 112 and the change in the current flowing in the transistor 413 are not balanced to each other. Namely, the change in the current of the transistor 413 is twice as large as the change in the current of the transistor 112. Accordingly, if those currents are directly fed to the output terminal $T_2$, the output bias at the output terminal $T_2$ would vary. However, this can be compensated by chosing the ratio of the resistances of the emitter resistors 621 and 622 of the grounded emitter transistors 611 and 612 connected to the collectors of the transistors 112 and 413 to be equal to 2:1, that is, by choosing the resistance of the emitter resistor 621 to be twice as high as the resistance of the emitter resistor 622 so that the current flowing in the emitter of the grounded emitter transistor 612 is twice as high as the current flowing in the grounded emitter transistor 611 to absorb the unbalance of the changes of currents in the transistors 112 and 413. In this case, however, it is assumed that the transistors 115 and 415 are identical and the resistances of the resistors 124 and 424 connected to the emitters of those transistors are identical.

Figure 10:
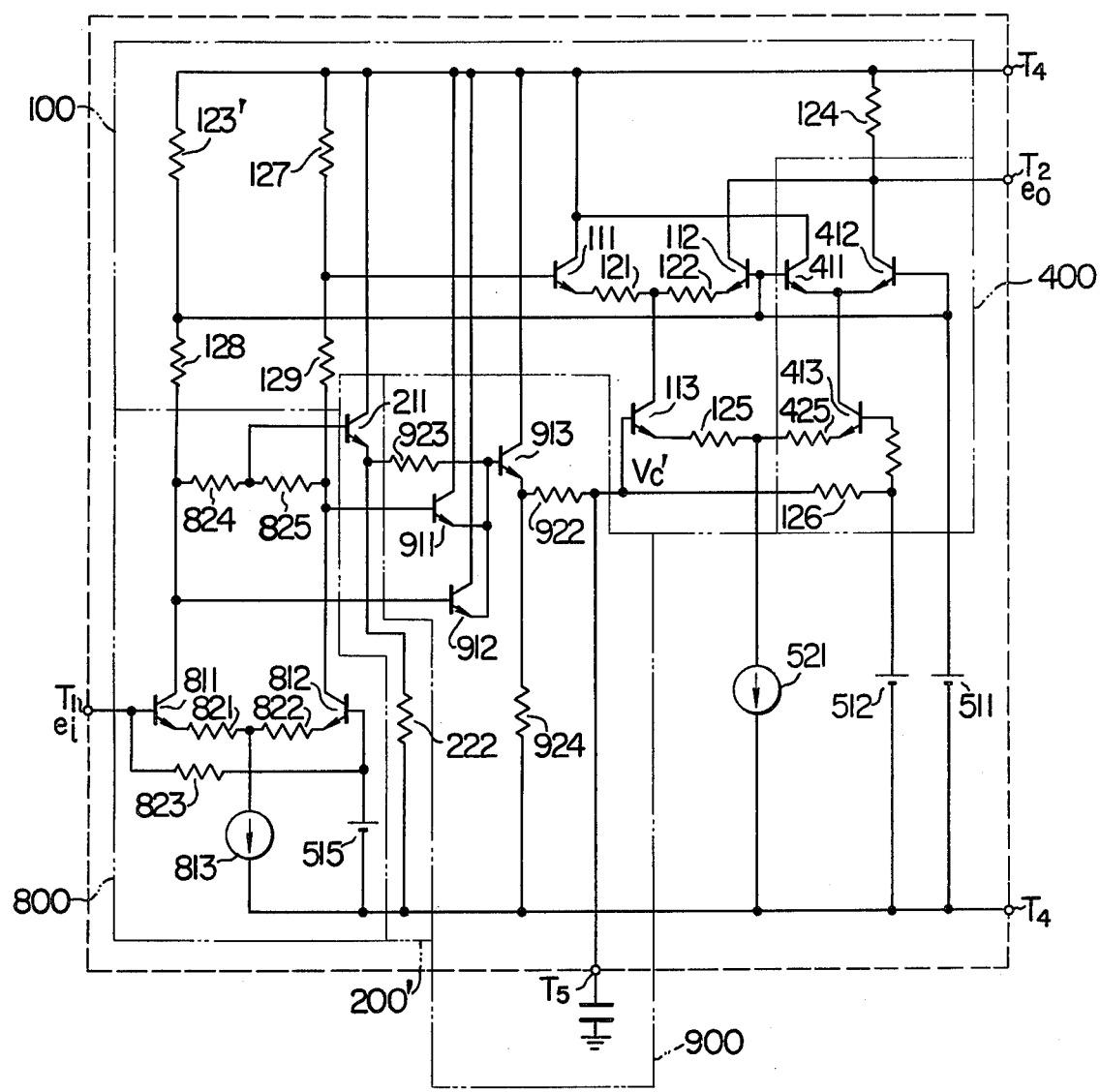
FIG. 10 shows a circuit diagram of a further embodiment of the limiter circuit of the present invention.

FIG. 10 shows a circuit diagram of a further embodiment of the limiter circuit of the present invention, in which like parts to those of FIG. 3 are designated by like numerals and they are not explained here. In FIG. 10, numeral 800 denotes a differential amplifier circuit which amplifies the modulation signal supplied to the input terminal $T_1$ and feeds the amplified signal to the bases of the differentially amplifying transistors 111 and 112 of the amplitude limiting amplifier circuit 100, and it comprises differentially amplifying transistors 811 and 812, a current source 813 and resistors 821–825. Emitters of the transistors 811 and 812 are coupled together through the resistors 821 and 822 and connected to the ground terminal $T_4$ through a current source 813. Collectors of the transistors 811 and 812 are coupled together through the resistors 824 and 825. The collector of the transistor 811 is connected to the base of the transistor 112 of the amplitude limiting amplifier circuit 100 through the resistor 128 and the collector of the transistor 812 is connected to the base of the transistor 111 of the amplitude limiting amplifier circuit 100 through the resistor 129. A base of the transistor 811 is connected to the input terminal $T_1$ and also connected to a base of the transistor 812 through the resistor 823. The base of the transistor 812 is connected to the ground terminal $T_4$ through the operating voltage supply 515.

Numeral 200' denotes a circuit which detects the modulation signal appearing across the resistors 824 and 825 of the differential amplifier circuit 800, and it comprises a transistor 211 and a resistor 222. A base of the transistor 211 is connected to a junction of the resistors 824 and 825, a collector thereof is connected to the power supply terminal $T_3$ and an emitter thereof is connected to the ground terminal $T_4$ through the resistor 222.

Numeral 900 denotes a full-wave rectifying circuit which full-wave rectifying the modulation signal detected by the detector circuit 200' and supplies the rectified voltage to the base of the current source transistor 113 of the amplitude limiting amplifier circuit 100, and it comprises rectifying transistors 911 and 912, a transistor 913 for supplying the rectified signal to the base of the transistor 113, a low-pass filter including a resistor 922 and a capacitor 941 and biasing resistors 923 and 924 for the transistor 913. Emitters of the transistors 911 and 912 are connected together and to a base of the transistor 913, and a collector of the transistors 911 and 912 are both connected to the power supply terminal $T_3$. Bases of the transistors 911 and 912 are connected to the bases of the differentially amplifying transistors 812 and 811, respectively, of the differential amplifier circuit 800. A base of the transistor 913 is connected to the emitter of the transistor 211 of the detector circuit 200' through the resistor 924, and an emitter of the transistor 913 is connected to the ground terminal $T_4$ through the resistor 925, and also connected to the base of the transistor 113 of the amplitude limiting amplifier circuit 100 through the resistor 922 and grounded through the terminal $T_5$ and the capacitor 941. The low-pass filter comprising the resistor 922 and the capacitor 941 functions to eliminate pulsive noises superimposed on the rectified signal.

The pulsating voltage derived from the full-wave rectifying circuit 900 changes in proportion to the magnitude of the modulation signal $e_i$ applied to the input terminal $T_1$, that is, the percent modulation. The pulsating voltage controls the operating current flowing in the transistor 113 of the amplitude limiting amplifier circuit 100 in accordance with the magnitude of the pulsive voltage, and acts as a control signal $V_c'$ which controls the input-output characteristic of the differentially amplifying transistors 111 and 112, that is, the limiting level.

Figure 11A:
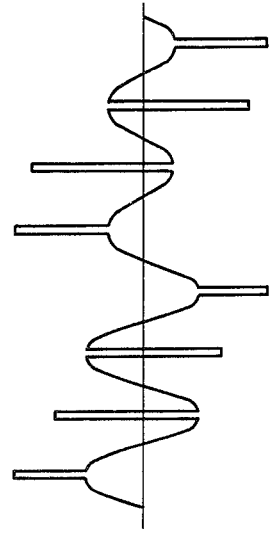
FIGS. 11A, 11B, 11C and 11D show waveforms for explaining the operation of the circuit of FIG. 10.
Figure 11B:
Figure 11C:
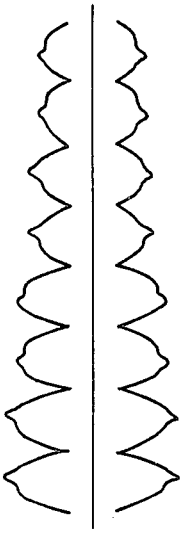
Figure 11D:
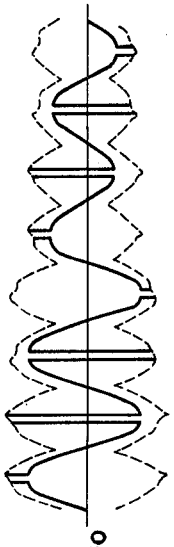

In the circuit configuration of FIG. 10, when a demodulation signal $e_i$ as shown in FIG. 11A is applied to the input terminal $T_1$, a control signal $V_c'$ presents a waveform as shown in FIG. 11B, and the limiting level changes vertically symmetrically as shown in FIG. 11C. This is because the amount of current flowing in the transistor 113 changes in proportion to the waveform of the control signal and hence a bias current which is proportional to the waveform of the control signal flows in the transistors 111 and 112. As a result, when the input demodulation signal $e_i$ increase in the positive direction, the input signal current up to the bias current flowing in the transistor 112 is amplified, but as the input signal current further increases, the transistor 112 is cut off to function the limiting operation. When the input demodulation signal $e_i$ increase in the negative direction, a similar operation occurs in the transistor 111. When the control signal $V_c'$ is zero, the limiting level is determined by an offset voltage of the transistor 113. Accordingly, an output waveform $e_o$ as shown in FIG. 11D appears at the output terminal $T_2$.

Figure 12:
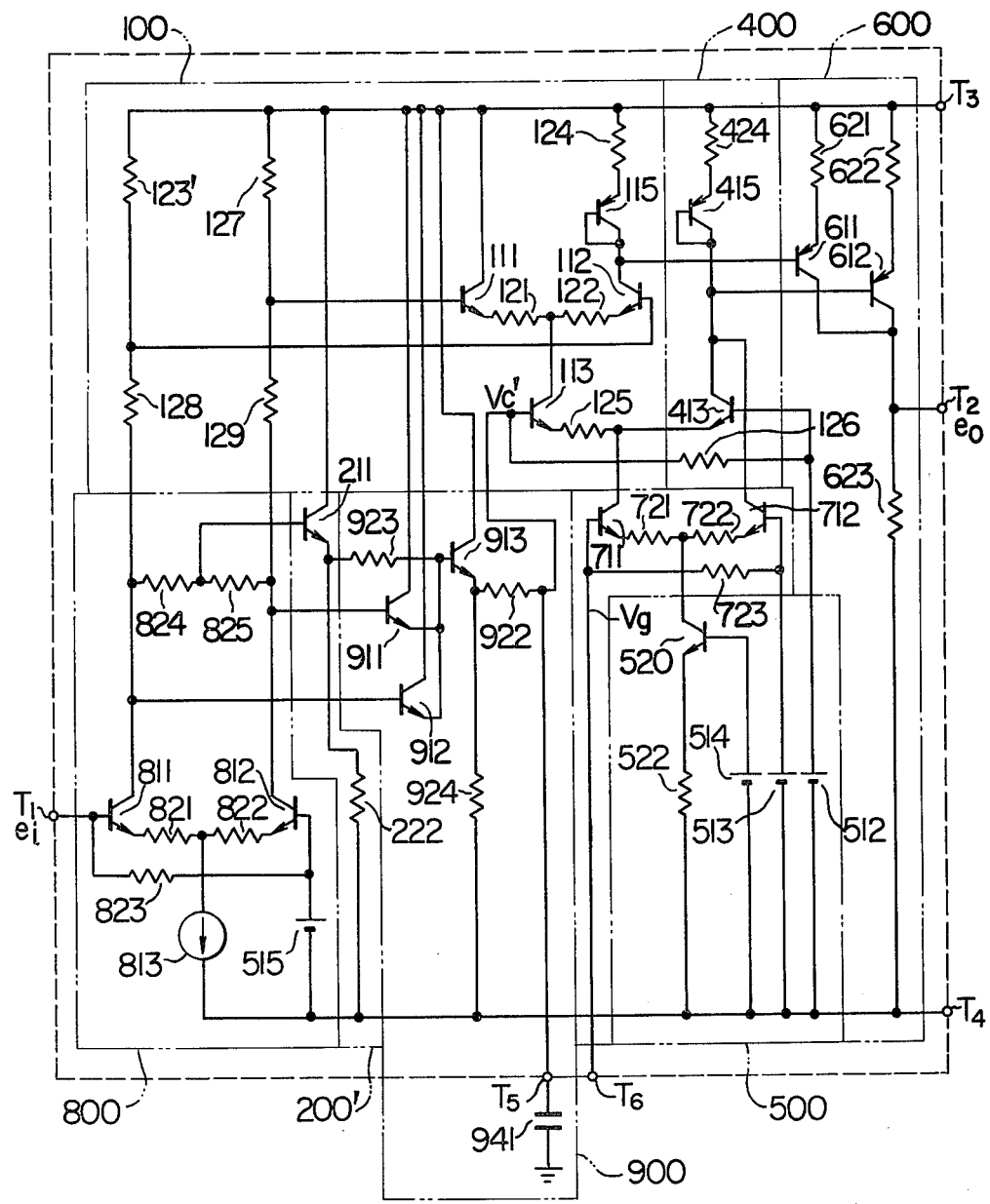
FIG. 12 shows a circuit diagram of an improved limiter circuit over the circuit of FIG. 10.

FIG. 12 shows a circuit diagram in which the AGC voltage control means and the gain compensating means described in connection with FIG. 9 are added to the circuit of FIG. 10. Like parts to those in the previous embodiments are designated by like numerals and the explanation thereof is omitted here.

As described hereinabove, the limiter circuit of the present invention facilitate the implementation in the IC structure and attains a satisfactory limiting effect to the pulsive noise. In addition, the limiting level can be changed in accordance with the magnitude of the modulation signal or the percent modulation.

What is claimed is:

1. A limiter circuit comprising:
    an amplitude limiting differential amplifier circuit including a differential amplifier having a modulation signal input terminal and a modulation signal output terminal for differentially amplifying a modulation signal applied to said input terminal and feeding an amplified signal to said output terminal and having a function of limiting a pulsive noise superimposed on said modulation signal, and a constant current source for supplying a bias current to said differential amplifier to drive said differential amplifier;
    a modulation signal detecting circuit for detecting the modulation signal applied to said input terminal;
    a rectifying circuit for rectifying a detected signal detected by said detecting circuit;
    means for removing the noise component of the rectified detected signal; and
    control means for applying a rectified voltage derived from said rectifying circuit with the noise component removed to said constant current source of said differential amplifier circuit to control the amount of constant current in accordance with the rectified voltage.

2. A limiter circuit according to claim 1, wherein said rectifying circuit produces a D.C. voltage from said detected modulation signal.

3. A limiting circuit according to claim 1, wherein said rectifying circuit comprises a full-wave rectifying circuit for producing a pulsive voltage from said detected modulation signal.

4. A limiter circuit according to claim 1, wherein said differential amplifier includes an output circuit having a load resistor and a gain compensating element for compensating for a change of gain of said differential amplifier due to the supply of said rectified voltage to said constant current source.

5. A limiter circuit comprising:
    a first differential amplifier having a constant current source;
    a second differential amplifier having one of the transistors constituting said first differential amplifier as a current source thereof;
    a third differential amplifier having the other of said transistors constituting said first differential amplifier as a current source thereof;
    a resistor connected to outputs of said second and third differential amplifiers as a common load thereof;
    means for supplying a modulation signal to an input of said second differential amplifier;
    means for extracting an output signal appearing across said load resistor;
    a modulation signal detecting circuit for detecting the modulation signal from said modulation signal supplying means;
    a rectifying circuit for rectifying a detected modulation signal detected by said detecting circuit to produce a D.C. voltage which is proportional to said modulation signal;
    means for removing the noise component from the rectified signal; and
    means for supplying the D.C. voltage derived from said rectifying circuit with the noise component removed to an input of said first differential amplifier.

6. A limiter circuit comprising:
    a first differential amplifier having a constant current source;
    a second differential amplifier having one of the transistors constituting said first differential amplifier as a current source thereof;
    a third differential amplifier having the other of said transistors constituting said first differential amplifier as a current source thereof;

a first load resistor connected to an output of said second differential amplifier as a load thereof;

a second load resistor connected to an output of said third differential amplifier as a load thereof;

means for supplying a modulation signal to an input of said second differential amplifier;

means for extracting output signals appearing across said first and second load resistors and combining the extracted signals;

a modulation signal detecting circuit for detecting the modulation signal from said modulation signal supplying means;

a rectifying circuit for rectifying the modulation signal detected by said detecting circuit to produce a D.C. voltage which is proportional to said modulation signal;

means for removing the noise component of the rectified detected signal; and means for supplying the D.C. voltage derived from said rectifying circuit with the noise component removed to an input of said first differential amplifier.

7. A limiter circuit according to claim 6, wherein said second differential amplifier includes an output circuit having a gain compensating element for compensating for a change of gain of said second differential amplifier due to the supply of said D.C. voltage to said first differential amplifier.

8. A limiter circuit according to claim 6, wherein said output signal extracting and combining means comprises a grounded emitter amplifier circuit.

9. A limiter circuit comprising:

a first differential amplifier having a constant current source;

a second differential amplifier having one of the transistors constituting said first differential amplifier as a current source thereof;

a third differential amplifier having one of the transistors constituting said second differential amplifier as a current source thereof;

a fourth differential amplifier having the other of said transistors constituting said first differential amplifier and the other of said transistors constituting said second differential amplifier as a current source thereof;

a resistor connected to outputs of said third and fourth differential amplifiers as a common load thereof;

means for supplying a modulation signal to an input of said third differential amplifier;

means for extracting an output signal appearing across said load resistor;

a modulation signal detecting circuit for detecting the modulation signal from said modulation signal supplying means;

a rectifying circuit for rectifying the modulation signal detected by said detecting circuit to produce a D.C. voltage which is proportional to said modulation signal;

means for supplying the D.C. voltage derived from said rectifying circuit to an input of said second differential amplifier; and means for supplying an AGC voltage in accordance with a carrier level to an input of said first differential amplifier.

10. A limiter circuit comprising:

a first differential amplifier having a constant current source;

a second differential amplifier having one of the transistors constituting said first differential amplifier as a current source thereof;

a third differential amplifier having one of the transistors constituting said second differential amplifier as a current source thereof;

a fourth differential amplifier having the other of said transistors constituting said first differential amplifier and the other of said transistors constituting said second differential amplifier as a current source thereof;

a first resistor connected to an output of said third differential as a load thereof;

a second resistor connected to an output of said fourth differential amplifier as a load thereof;

means for supplying a modulation signal to an input of said third differential amplifier;

means for extracting output signals appearing a cross said first and second load resistors and combining the extracted signals;

a modulation signal detecting circuit for detecting the modulation signal from said modulation signal supplying means;

a rectifying circuit for rectifying the modulation signal detected by said detecting circuit to produce a D.C. voltage which is proportional to said modulation signal;

means for supplying the D.C. voltage derived from said rectifying circuit to an input of said second differential amplifier; and means for supplying an AGC voltage in accordance with a carrier level to an input of said first differential amplifier.

11. A limiter circuit according to claim 9, wherein said third differential amplifier includes an output circuit having a gain compensating element for compensating for a change of gain of said third differential amplifier due to the supply of said D.C. voltage to said second differential amplifier and the supply of said AGC voltage to said first differential amplifier.

12. A limiter circuit comprising:

a first differential amplifier having a constant current source;

a second differential amplifier having one of the transistor constituting said first differential amplifier as a current source thereof;

a third differential amplifier having one of said transistors constituting said second differential amplifier as a current source thereof;

a first resistor connected to an output of said third differential amplifier as a load thereof;

a second resistor connected in common to an output of the other of said transistors constituting said first differential amplifier and an output of the other of said transistors constituting said second differential amplifier as a load thereof;

means for supplying a modulation signal to an input of said third differential amplifier;

means for extracting output signals appearing across said first and second load resistors and combining the extracted signals;

a modulation signal detecting circuit for detecting the modulation signal from said modulation signal supplying means;

a rectifying circuit for rectifying the modulation signal detected by said detecting circuit to produce a D.C. voltage which is proportional to said modulation signal;

means for supplying the D.C. voltage derived from said rectifying circuit to an input of said second differential amplifier; and means for supplying an AGC voltage in accordance with a carrier level to an input of said first differential amplifier.

13. A limiter circuit according to claim 12, wherein said third differential amplifier circuit includes an output circuit having a gain compensating element for compensating for a change of gain of said third differential amplifier due to the supply of said D.C. voltage to said second differential amplifier and the supply of said AGC voltage to said first differential amplifier.

14. A limiter circuit according to claim 12, wherein said output signal extracting and combining means comprises a grounded emitter amplifier circuit.

15. A limiter circuit comprising:
a first differential amplifier having a constant current source;
a second differential amplifier having one of the transistors constituting said first differential amplifier as a current source thereof;
a third differential amplifier having the other of said transistors constituting said first differential amplifier as a current source;
a resistor connected to outputs of said second and third differential amplifiers as a common load thereof;
means for supplying a modulation signal to an input of said second differential amplifier;
means for extracting an output signal appearing across said load resistor;
a modulation signal detecting circuit for detecting the modulation signal from said modulation signal supplying means;
a full-wave rectifying circuit for rectifying the modulation signal detected by said detecting circuit to produce a pulsating voltage which is proportional to said modulation signal; and
means for supplying the pulsating voltage derived from said full-wave rectifying circuit to an input of said first differential amplifier.

16. A limiter circuit comprising:
a first differential amplifier having a constant current source;
a second differential amplifier having one of the transistors constituting said first differential amplifier as a current source thereof;
a third differential amplifier having one of the transistors constituting said second differential amplifier as a current source thereof;
a first resistor connected to an output of said third differential amplifier as a load thereof;
a second resistor connected in common to an output of the other of said transistors constituting said first differential amplifier and an output of the other of said transistors constituting said second differential amplifier as a load thereof;
means for supplying a modulation signal to an input of said third differential amplifier;
means for extracting output signals appearing across said first and second load resistors and combining the extracted signals;
a modulation signal detecting circuit for detecting the modulation signal from said modulation signal supplying means;
a full-wave rectifying circuit for rectifying the modulation signal detected by said detecting circuit to produce a pulsating voltage which is proportional to said modulation signal;
means for supplying the pulsating voltage derived from said full-wave rectifying circuit to an input of said second differential amplifier; and
means for supplying an AGC voltage in accordance with a carrier level to an input of said first differential amplifier.

17. A limiter circuit comprising:
an input terminal to which a modulation signal is applied;
an output terminal from which an output signal is derived;
a first differential amplifier including first and second transistors whose emitters are commonly connected to each other, a base of said first transistor being connected to the input terminal so as to be supplied with the modulation signal;
a second differential amplifier including third and fourth transistors whose emitters are commonly connected to each other, a collector of said third transistor being connected in common to the emitters of said first and second transistors;
a constant current source connected in common to the emitters of said third and fourth transistors for allowing a constant current to flow through said third and fourth transistors in differential manner;
load means connected to a collector of said fourth transistor for supplying an output signal appearing at the collector of said fourth transistor to said output terminal;
a first bias source for providing a first bias potential to a base of said second transistor;
a detector for receiving and detecting magnitude of said modulation signal applied at the input terminal;
a rectifier circuit for rectifying a detected output signal of the detector so as to produce a rectified voltage corresponding to the percentage modulation of the modulating signal;
control means for applying the rectified voltage to a base of said third transistor; and
a second bias source for providing to a base of said fourth transistor a second bias potential which is so determined that a limiting level of said first differential amplifier is slightly larger than a level of 100% modulation of said modulating signal.

18. A limiter circuit according to claim 17, said load means comprising; a third differential amplifier which includes a fifth and sixth transistors whose emitters are commonly connected to each other and also connected in common to the collector of said fourth transistor; means for connecting bases of said fifth and sixth transistors to the base of said fourth transistor; means for connecting a collector of said fifth transistor to that of the first transistor; means for connecting collector of said sixth transistor to that of the second transistor as well as to the output terminal, and a load impedance element connected to the collector of said sixth transistor.

19. A limiter circuit according to claim 17, said load means comprising; an impendace element connected to the collector of said fourth transistor; a fifth transistor of different conductivity type from that of said first through fourth transistors, whose base is connected to the collector of said second transistor, a sixth transistor of the conductivity type same as that of the fifth transistor whose base is connected to the collector of said fourth transistor; and means for connecting collectors of said fifth and sixth transistors in common to the output terminal.

20. A limiter circuit according to claim 1, 5, or 6, wherein said removing means comprises a smoothing circuit for extracting a D.C. voltage from the rectified voltage.

21. A limiter circuit according to claim 1, 5, or 6, wherein said removing means comprises a low pass filter.

22. A limiter circuit according to claim 1, 5, or 6, wherein said removing means is coupled at the output of the rectifying circuit.

23. A limiter circuit according to claim 6, wherein said second differential amplifier includes an output circuit having a gain compensating element connected in series with said first load resistor for compensating for a change of gain of said second differential amplifier due to the supply of said D.C. voltage to said first differential amplifier, said third differential amplifier includes an output circuit having an output bias compensating element connected in series with said second load resistor for compensating for the change of the output bias at the output of said third differential amplifier.

24. A limiter circuit according to claim 20, wherein said output signal extracting and combining means comprises a first grounded emitter amplifying transistor circuit which amplifies a signal appearing at the output of said second differential amplifier and cooperates with said gain compensating element to compensate for the changes of the operating resistance of said second differential amplifier to keep the gain of the entire circuit constant and a second grounded emitter amplifying transistor circuit which amplifies a signal appearing at the output of said third differential amplifier and cooperates with said output bias compensating element to compensate for the changes of the output bias at the output of said third differential amplifier.

* * * * *

UNITED STATES PATENT AND TRADEMARK OFFICE
CERTIFICATE OF CORRECTION

PATENT NO. : 4,197,505
DATED : April 8, 1980
INVENTOR(S) : H. Nishijima et al

It is certified that error appears in the above-identified patent and that said Letters Patent are hereby corrected as shown below:

The front page of the patent should indicate the following under

Foreign Application Priority Data:

"Jan. 30, 1978 [JP] Japan............53-8244"

Signed and Sealed this

Eleventh Day of November 1980

[SEAL]

Attest:

SIDNEY A. DIAMOND

Attesting Officer     Commissioner of Patents and Trademarks